US012241865B2

(12) United States Patent
Xiao et al.

(10) Patent No.: US 12,241,865 B2
(45) Date of Patent: Mar. 4, 2025

(54) MAGNETIC GRADIOMETER BASED ON MAGNETIC TUNNEL JUNCTIONS IN MAGNETIC VORTEX STATE (VORTEX MTJ)

(71) Applicants: BROWN UNIVERSITY, Providence, RI (US); KING ABDULLAH UNIVERSITY OF SCIENCE AND TECHNOLOGY, Thuwal (SA)

(72) Inventors: Gang Xiao, Providence, RI (US); Guanyang He, Providence, RI (US); Yiou Zhang, Providence, RI (US); Xixiang Zhang, Thuwal (SA)

(73) Assignees: BROWN UNIVERSITY, Providence, RI (US); KING ABDULLAH UNIVERSITY OF SCIENCE AND TECHNOLOGY (SA)

( * ) Notice: Subject to any disclaimer, the term of this patent is extended or adjusted under 35 U.S.C. 154(b) by 130 days.

(21) Appl. No.: 18/019,286

(22) PCT Filed: Aug. 4, 2021

(86) PCT No.: PCT/US2021/044547
§ 371 (c)(1),
(2) Date: Feb. 2, 2023

(87) PCT Pub. No.: WO2022/031852
PCT Pub. Date: Feb. 10, 2022

(65) Prior Publication Data
US 2023/0333057 A1 Oct. 19, 2023

Related U.S. Application Data

(60) Provisional application No. 63/060,708, filed on Aug. 4, 2020.

(51) Int. Cl.
*G01N 27/82* (2006.01)
(52) U.S. Cl.
CPC ................................. *G01N 27/82* (2013.01)
(58) Field of Classification Search
CPC ............... G01N 27/82; G01R 33/0017; G01R 33/0052; G01R 33/0094; G01R 33/022; G01R 33/098; G01R 33/14
See application file for complete search history.

(56) References Cited

U.S. PATENT DOCUMENTS 6,411,085 B1 * 6/2002 Siegel .................... G01N 27/82
324/240
6,586,930 B1 * 7/2003 Kumar .................... G01B 7/10
324/225

(Continued)

*Primary Examiner* — Vinh P Nguyen
(74) *Attorney, Agent, or Firm* — Tarolli, Sundheim, Covell & Tummino LLP

(57) ABSTRACT

A magnetic gradiometer can be used in systems or methods for nondestructive testing, even when the material being tested is weakly magnetic. The magnetic gradiometer can include a printed circuit board (PCB) comprising a first end and a second end separated by a base length; an excitation coil encircling at least a portion of the PCB and configured to deliver an alternating current (AC) to generate an excitation magnetic field; and a differential sensor. The differential sensor can include a reference magnetic tunneling junction in magnetic vortex state (vortex MTJ) sensor array at the first end to generate a voltage based on the excitation magnetic field; and a signal vortex MTJ sensor array at the second end to generate another voltage based on the excitation magnetic field due to a composition of the measurement target. The second end of the PCB can be oriented towards the measurement target.

19 Claims, 13 Drawing Sheets

(56) References Cited

U.S. PATENT DOCUMENTS

| | | | | |
|---|---|---|---|---|
| 6,998,840 B2* | 2/2006 | Choi | .................. | G01R 33/04 |
| | | | | 324/253 |
| 7,126,331 B2* | 10/2006 | Johnson | ............... | G01R 33/022 |
| | | | | 324/252 |
| 7,202,661 B2* | 4/2007 | Keene | .................. | G01V 3/105 |
| | | | | 324/244 |
| 11,988,727 B1* | 5/2024 | Kubena | ................. | H10N 35/85 |

* cited by examiner $R = NR_{MTJ}$ $S_T = \sqrt{\dfrac{1}{N}} S_T^{MTJ}$ (a)

$R = \dfrac{1}{M} R_{MTJ}$ $S_T = \sqrt{\dfrac{1}{M}} S_T^{MTJ}$ (b)

$R = \dfrac{N}{M} R_{MTJ}$ $S_T = \sqrt{\dfrac{1}{MN}} S_T^{MTJ}$ (c)

MAGNETIC GRADIOMETER BASED ON MAGNETIC TUNNEL JUNCTIONS IN MAGNETIC VORTEX STATE (VORTEX MTJ)

TECHNICAL FIELD

The present disclosure relates generally to nondestructive testing and, more specifically, to a magnetic tunnel junction in magnetic vortex state (vortex MTJ) sensor-based magnetic gradiometer that can be used for nondestructive testing.

BACKGROUND

The 2010 Deepwater Horizon oil spill disaster in the Gulf of Mexico was the largest marine oil spill in history, causing untold ecological harm and billions of dollars of economic damage. Unfortunately, the Deepwater Horizon oil spill disaster, like many other industrial accidents, was due to undetected material defects or inhomogeneities in building materials. Such material defects or inhomogeneities could have been detected with proper nondestructive testing, potentially preventing the Deepwater Horizon disaster. Nondestructive testing (NDT) is widely used in industry for noninvasively inspecting materials for defects or inhomogeneity. Common techniques in nondestructive testing include ultrasonic sensing, Eddy-current testing, and magnetic flux leakage (MFL) measurement.

MFL measurement is used to detect changes in magnetic fields in the vicinity of structural defects in magnetic materials. However, current MFL testing equipment does not have a high enough spatial and depth resolution to detect defects of a relatively small size (e.g., 5 cm or smaller defects) at distances required in real-world situations, such as when the defect is underneath the surface of a material to be tested or if another object is blocking the material that is being tested. Additionally, current MFL testing has limited utility when used with weakly magnetic materials, such as magnetic cement, which is only weakly magnetic due to cement only being able to contain approximately a 5% magnetic particle composition and retain structural stability.

SUMMARY

Described herein are systems and methods for nondestructive testing using a magnetic tunnel junction in magnetic vortex state (vortex MTJ) sensor-based magnetic gradiometer. The systems and methods can increase material confidence and safety in a variety of industrial applications and beyond. The systems and methods can utilize vortex MTJ sensors to detect small fluctuations in magnetic fields produced by even weakly magnetic materials to detect material defects and inhomogeneities that are of a relatively small size, and/or at certain depths within the tested material.

A magnetic gradiometer can be used in a system for nondestructive testing that can detect defects or inhomogeneity that are of a relatively small size, and/or at certain depths within the tested material, even when the tested material is weakly magnetic. The magnetic gradiometer can include a printed circuit board (PCB) comprising a first end and a second end separated by a length; an excitation coil encircling at least a portion of the PCB and configured to deliver an alternating current (AC) to generate an excitation magnetic field; and a differential sensor. The differential sensor can include a reference vortex MTJ sensor array proximal to the first end to generate a voltage based on the excitation magnetic field; and a signal vortex MTJ sensor array proximal the second end to generate another voltage based on the excitation magnetic field due to a composition of a measurement target. The second end of the PCB can be oriented towards the measurement target. The reference vortex MTJ sensor and the signal vortex MTJ sensor are separated by a base length.

A method for nondestructive testing that can detect defects or inhomogeneity that are of a relatively small size, and/or at certain depths within the tested material, even when the tested material is weakly magnetic. The method can include generating a magnetic field by applying an AC to an excitation coil of a magnetic gradiometer; scanning the magnetic gradiometer across a body comprising at least one measurement target; and generating an output voltage of the magnetic gradiometer in response to scanning the magnetic gradiometer across the body comprising the at least one measurement target. The magnetic gradiometer can include a PCB comprising a first end and a second end separated by a base length, wherein the first end is oriented towards one of the at least one measurement targets; an excitation coil encircling at least a portion of the PCB; and a differential sensor. The differential sensor can include a reference vortex MTJ sensor array proximal to the first end; and a signal vortex MTJ sensor array proximal to the second end. The output voltage can be based on a voltage generated by the reference vortex MTJ sensor array's detection of at least an excitation magnetic field and another voltage generated by the signal vortex MTJ sensor array's detection of the excitation magnetic field due to a composition of the body comprising the at least one measurement target.

BRIEF DESCRIPTION OF THE DRAWINGS

The foregoing and other features of the present disclosure will become apparent to those skilled in the art to which the present disclosure relates upon reading the following description with reference to the accompanying drawings, in which.

DETAILED DESCRIPTION

I. Definitions

Figure 1:
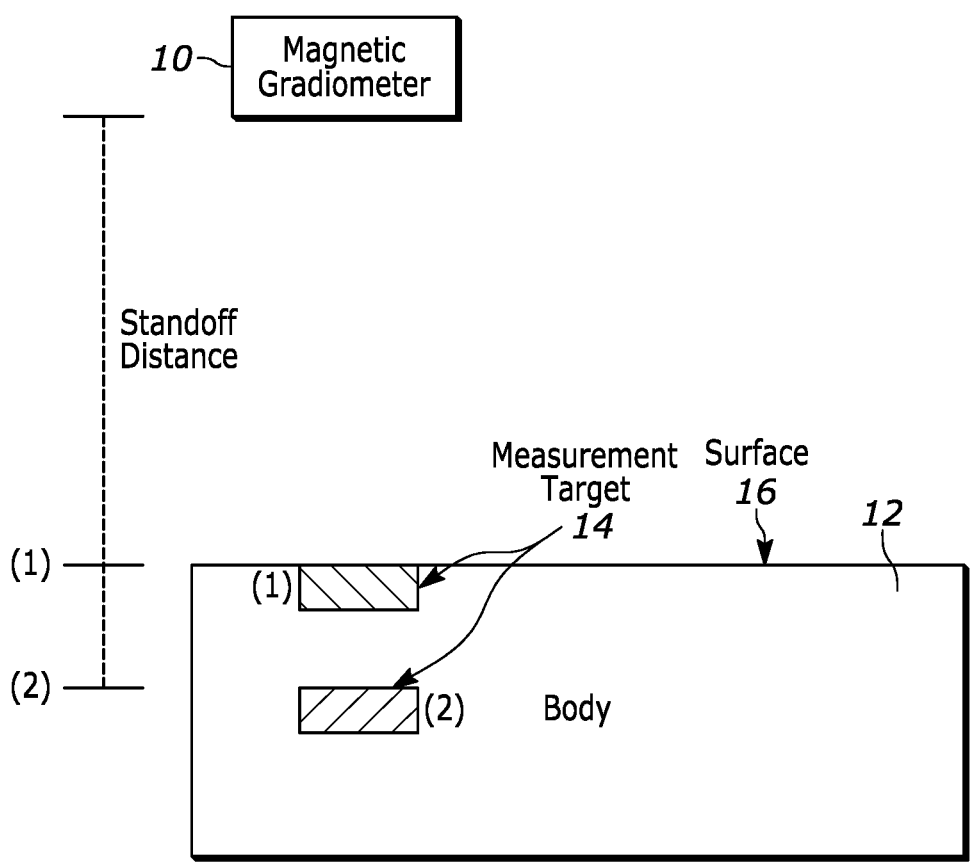
FIG. 1 is block diagram of an example use of at a magnetic gradiometer based on magnetic tunnel junctions in a magnetic vortex state (vortex MTJ) sensor-based, described herein, that can be used for nondestructive testing.

Unless otherwise defined, all technical terms used herein have the same meaning as commonly understood by one of ordinary skill in the art to which the present disclosure pertains.

As used herein, the singular forms "a," "an" and "the" can also include the plural forms, unless the context clearly indicates otherwise.

As used herein, the terms "comprises" and/or "comprising," can specify the presence of stated features, steps, operations, elements, and/or components, but do not preclude the presence or addition of one or more other features, steps, operations, elements, components, and/or groups.

As used herein, the term "and/or" can include any and all combinations of one or more of the associated listed items.

As used herein, the terms "first," "second," etc. should not limit the elements being described by these terms. These terms are only used to distinguish one element from another. Thus, a "first" element discussed below could also be termed a "second" element without departing from the teachings of the present disclosure. The sequence of operations (or acts/steps) is not limited to the order presented in the claims or figures unless specifically indicated otherwise.

As used herein, the term "gradiometer" refers to a device that can measure the gradient (numerical rate of change) of an energy field. One type of gradiometer is a magnetic gradiometer, a device that can measure the gradient of a magnetic field at a point in space or within a body (e.g., to detect a measurement target). The terms "gradiometer" and "magnetic gradiometer" may be used interchangeably herein.

As used herein, the term "magnetic field" refers to a vector field that describes the magnetic influence on moving electric charges, electric currents, and/or magnetic materials. For example, a magnetic field can include an excitation magnetic field and an ambient magnetic field. The term "excitation magnetic field" is used herein to describe the magnetic field generated by the excitation coil, which fluctuates based on the composition of a measurement target and the term "ambient magnetic field" is used herein to describe the magnetic field of the surrounding environment of the measurement target and magnetic gradiometer. The ambient magnetic field can include, but is not limited to, the Earth's magnetic field, the magnetic field of one or more nearby magnetic objects that is not the measurement target, or other sources of noise.

As used herein, the term "magnetic tunneling junction" or "MTJ" refers to a material comprising at least two layers of ferromagnetic material separated by at least one insulating layer. If the insulating layer is thin enough, electrons can tunnel from one ferromagnet to the other. An MTJ material can used to form a sensor element, which may include additional layers. MTJ sensor elements are noteworthy for their high sensitivity, ease of use, small size, low cost, and low power consumption. A plurality of sensor elements can be connected in series and/or in parallel.

As used herein, the term "magnetic vortexing state" refers to one of the fundamental magnetization ground states of a MTJ sensor, which is characterized by minimization of demagnetizing energy at the expense of exchange energy. This state is at least substantially free of hysteresis with a good thermal stability.

As used herein, the term "substantially" refers to being largely something that is specified. Something that is "at least substantially" includes from a large/significant part of something (e.g., greater than 90%, 95%, 99%, or the like) to the entirety of something (e.g., 100%), As used herein, the term "printed circuit board" or "PCB" refers to part of a device that mechanically supports and electrically connects from one or more conductive sheet layers (e.g., a metal, like copper) laminated onto and/or between sheet layers of a non-conductive substrate.

As used herein, the term "excitation coil" refers to any device (e.g., a wire wound into a coil) that can facilitate the creation of a magnetic field from an electric current.

As used herein, the terms "material defect" and "material inhomogeneity" refer to anything that alters the magnetic field of a measurement target within a body from the magnetic fields detected from the surrounding magnetic field measurements. Example material defects or inhomogeneities can include, but are not limited to, cracks, holes, changes in material composition, or the like.

As used herein, the term "hysteresis" refers to the phenomenon in which a value of a physical property lags behind changes in the effect causing the physical property.

As used herein, the term "sensitivity" refers to the amount of change in the output (e.g., voltage) of the sensing device caused by one unit of change in the quantity under measurement (e.g., one Gauss of magnetic field).

As used herein, the term "standoff distance" refers to the distance between the signal vortex MTJ and the measurement target.

As used herein, the term "measurement target" refers to a point (with certain volume) in space being studied with a gradiometer. For example, the measurement target can be a point within a body or on a surface of a body under investigation for material defects and/or material inhomogeneities.

As used herein, the term "body" refers to a physical structure such as a cement wall, a steel beam, a pipe body, a product, a device, a material, a sample, an animal or human body, or any portion thereof, or the like.

As used herein, the term "surface" refers to an exterior boundary of a body. A material defect or inhomogeneity can occur at the surface of a body, beneath the surface of a body or stretch from the surface of the body into an interior portion of the body.

As used herein, the term "proximal" refers to a state of a first object being situated near a second object. For example, a first object that is proximal to a second object can be close in distance to the second object (e.g., a few cm or less) or actually contacting the second object.

As used herein, the term "magnetic vortex state" refers to a vortex magnetization state. The vortex magnetic state is favored by ferromagnetic layers with lateral dimensions exceeding the exchange length over a single-domain state, where the magnetostatic energy dominates over the exchange energy. When sensors are disk shaped, a vortex core can undergo reversible displacement, as long as the magnetic field is not so large that it annihilates the vortex, leading to at least substantially hysteresis-free behavior in the center of the magnetic transfer curve. Compared with other linearization strategies, a vortex-state MTJ completely eliminates substantially all magnetic hysteresis and shows good thermal stability.

II. Overview

Nondestructive testing (NDT) is widely used for noninvasively inspecting materials for defects or inhomogeneity. Common techniques in NDT include: ultrasonic sensing, Eddy-current testing, and magnetic flux leakage (MFL) measurement. Eddy-current testing is only effective for inspecting conductive metals at close distances. The distance between the sensor and the sample surface to be detected, defined as the standoff distance, is typically as small as 1 mm for Eddy-current testing. MFL testing is used to detect the magnetic field leakage in the vicinity of structural defects. Tunneling magneto-resistive (TMR) sensors have been applied in MFL that exhibit 20 cm standoff distances, but with a relatively low spatial resolution. MFL with TMR sensors is also restricted to strongly ferromagnetic materials. For weakly magnetic materials, the decay of the magnetic signals over distance limits the standoff distance of MFL with TMR sensors.

Described herein are systems and methods for nondestructive testing that can employ a magnetic gradiometer to detect defects or inhomogeneity that are of a relatively small size, and/or at certain depths within the tested material, even when the tested material is weakly magnetic. The magnetic gradiometer is compact and immune to the excitation field that is provided by an excitation coil due to an alternating current (AC). The magnetic gradiometer takes the differential signal from two magnetic tunneling junction in magnetic vortex state (vortex MTJ) sensor arrays separated by a certain distance called base length, to distinguish a gradient field from common backgrounds such as the excitation field, the Earth's magnetic field, environmental electromagnetic interference, or other sources of noise. Using the differential signal also allows the gradiometer to operate in harsh environment with magnetic interferences, such as in an underground borehole. The gradient field to be measured can come from localized magnetic sources such as a crack on or inside the cement, since it breaks the homogeneous magnetization.

III. Systems

An aspect of the present disclosure can include a magnetic tunnel junction in magnetic vortex state (vortex MTJ) sensor-based magnetic gradiometer (magnetic gradiometer 10). As shown in FIG. 1, the magnetic gradiometer 10 can detect a change in a magnetic field due to a measurement target 14 in a body 12. The body 12 is larger than the measurement target 14 and at least weakly magnetic. In some instances, the measurement target 14 can include a material defect, an inhomogeneity, or the like (e.g., a crack in cement).

Material defects, inhomogeneities, or the like, in the measurement target 14 can be detected by scanning the magnetic gradiometer 10 over the body 12 and measuring the magnetic field at one or more measurement targets 14. The presence of the material defects, inhomogeneities, or the like, in the measurement target 14 can cause an increase or decrease in magnetic field detected by the magnetic gradiometer 10, leading to an increase or decrease in the output voltage or current. The magnetic gradiometer 10 can be preferable to traditional testing mechanisms because the magnetic gradiometer 10 is of a compact size, extremely sensitive, and immune to a harsh environment without requiring a shield for the ambient magnetic field. The magnetic gradiometer 10 can have utility in many applications, including diagnostics-while-drilling applications, non-contact measurement applications, and countless other applications.

Diagnostics-while-drilling applications can be used to provide real-time information about a downhole environment (e.g., a body 12 being, for example, a cement retaining wall in an oil well) in oil fields, allowing fast decisions to be made by the driller, as long as the body 12 is weakly magnetic. The magnetic gradiometer 10 can detect structural defects in cement in the well so that the driller can repair the defects to prevent oil spill disasters. Additionally, data provided from diagnostics-while-drilling systems can provide researchers with valuable, high fidelity data sets necessary for improved understanding of the drilling. For example, more than one magnetic gradiometer can be mounted on a platform, for example in a radial configuration for multiple detection points.

Non-contact measurement applications can measure properties of a body 12 without touching the body 12. The magnetic gradiometer 10 can be used within a probe (hand-held or otherwise) instrument to measure the magnetic properties, for example magnetic susceptibility of an at least weakly magnetic material without touching a body 12 of the material. Non-contact measurement can be used to inspect the uniformity or inhomogeneity of body 12 and can also be used for scientific research on the body 12, inspection, quality control, and failure analysis of products and prototypes.

Diagnostics-while-drilling and non-contact measurement are both examples of nondestructive testing. The magnetic gradiometer 10, as shown in FIG. 1, can be oriented with one end towards a body 12 and held a standoff distance (STANDOFF DISTANCE) away from a measurement target 14 within the body 12 that is suspected to include a material defect and/or inhomogeneity to facilitate non-destructive testing. The magnetic gradiometer 10 can detect the measurement 14 target within the body 12 while separated from the measurement target 14 by the standoff distance (STANDOFF DISTANCE). The standoff distance (STANDOFF DISTANCE) being the distance between the measurement target 14 and a signal vortex MTJ sensor array (not shown in FIG. 1) proximal to the end of the magnetic gradiometer 10 oriented towards the body 12.

The measurement target 14 (1) can be on a surface 16 of the body 12 (measurement target (1)) or the measurement target 14 (2) can be inside a body 12 (measurement target (2)). The measurement target 14 can also stretch from the surface 16 of the body 12 into an inner portion of the body 12 (example not shown). When the measurement target 14 is on the surface 16 of the body 12 (measurement target 14(1)) the standoff distance (STANDOFF DISTANCE (1)) is also the distance between the surface 16 of the body 12 and the signal vortex MTJ sensor array on the magnetic gradiometer 10. When the measurement target 14 is inside the body 12 (measurement target 14(2)) the standoff distance ((STANDOFF DISTANCE) (2)) is measured through the body to a depth under the surface 16 of the body. The voltage output by the magnetic gradiometer 10 is based, at least in part, on the standoff distance and the material of the body 12, if the measurement target 14(2) is inside the body. In one example, the standoff distance is 50 cm or less, 25 cm or less, 15 cm or less, 10 cm or less, 5 cm or less, or 2 cm or less. A body 12 can contain more than one measurement target and the measurement targets can be at different depths and locations in the body. In diagnostics-while-drilling and non-contact measurement applications larger standoff distances than traditionally possible for the necessary spatial and depth resolution to see material defects, inhomogeneities, or the like are needed to detect the compositions of materials further from the surface of a body (e.g., deeper in the body) and/or to detect the compositions of offset materials (e.g., concrete oil well walls separated from the magnetic gradiometer by a plexiglass or fiberglass casing).

Figure 2:
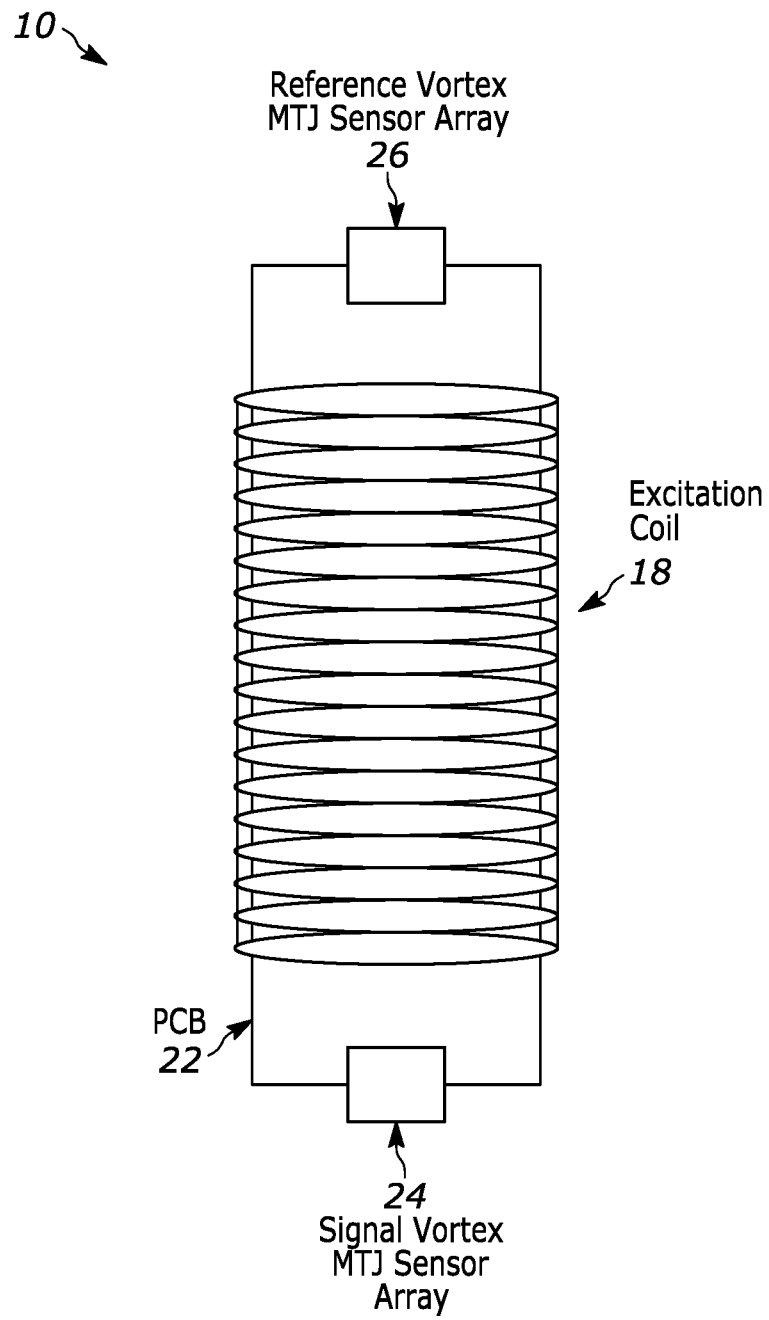
FIG. 2 is a block diagram of an example vortex MTJ sensor-based magnetic gradiometer shown in FIG. 1.
Figure 3:
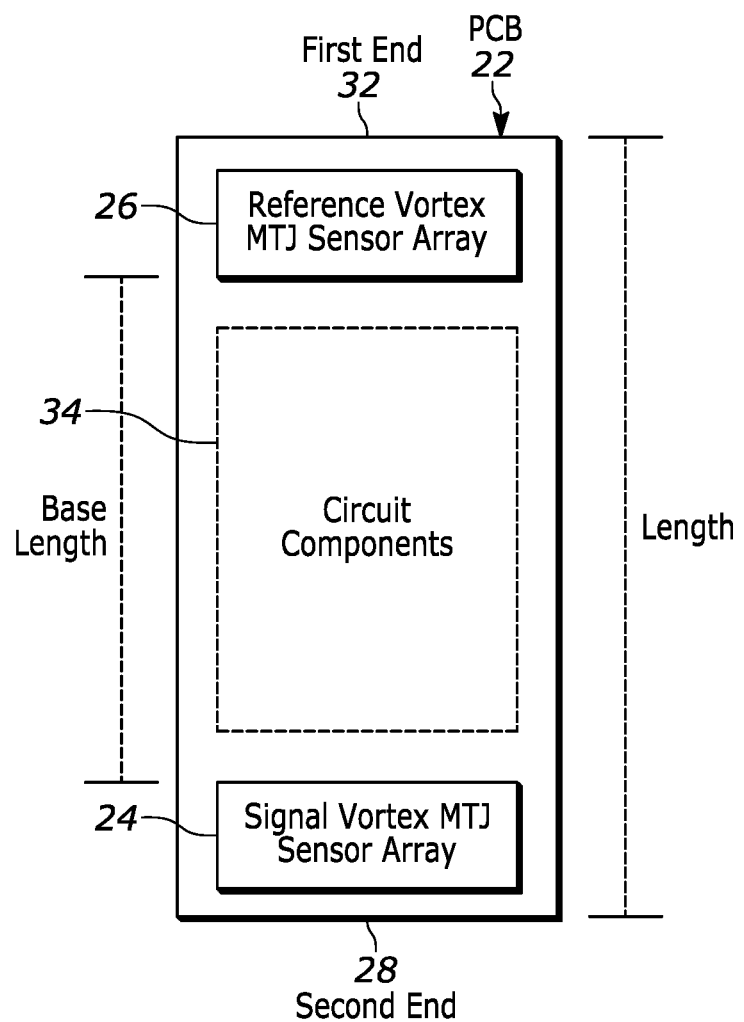
FIG. 3 is a block diagram of the portion of the vortex MTJ sensor-based magnetic gradiometer associated with a printed circuit board (PCB) including reference and signal magnetic vortex state (vortex MTJ) sensor arrays shown in FIG. 2.

The magnetic gradiometer 10 is shown in more detail in FIGS. 2 and 3. In FIG. 2, the magnetic gradiometer 10 includes one or more excitation coils 18 encircling at least a portion of printed circuit board (PCB) 22 that includes a reference magnetic tunneling junction in magnetic vortex state (vortex MTJ) sensor array 26, a signal vortex MTJ sensor array 24, and additional circuitry. As illustrated in FIG. 2, the reference vortex MTJ sensor array 26 and the signal vortex MTJ sensor array 24 are proximal opposing ends of the PCB 22. While FIG. 2 shows the reference vortex MTJ sensor array 26 and the signal vortex MTJ sensor array 24 poking outside the one or more excitation coils 18, the one or more excitation coils 18 can extend beyond at least one of the opposing ends of the PCB 22. The excitation coil 18 can deliver an alternative current (AC) for the magnetic gradiometer 10 to generate an excitation magnetic field. Unlike other types of magnetic gradiometers, the magnetic gradiometer 10 can utilize the AC to generate the magnetic field because the magnetic gradiometer 10 can eliminate the ambient magnetic field and other noise due to the differential nature of the configuration of the vortex MTJ sensory arrays 24, 26 on the magnetic gradiometer 10, which has high sensitivity, large dynamic range (e.g., ~100 Oe), high common mode rejection ratio (CMRR) (e.g., 82 dB), and low temperature coefficient. The large dynamic range and the high CMRR help to allow for measurement in an ambient (or otherwise noisy) environment without magnetic shielding. Moreover, the magnetic gradiometer 10 utilizes state-of-the art MTJ sensors that offer high performance, including at least substantially hysteresis-free (e.g., relatively low hysteresis from 0 to 1 Oe), low power consumption (e.g., ~1 mW), broad bandwidth (e.g., up to GHz), miniaturized size (e.g., ~10 μm), high temperature operation (e.g., ~350° C.), and a fabrication process compatible with and comparable to silicon circuit technologies. Although not shown, the magnetic gradiometer 10 can be attached to a power source (e.g., a battery) and display device comprising a display, a processor, and a non-transitory memory (e.g., a computer, a smartphone, a probe, etc.).

As shown in FIG. 3, the PCB 22 has a first end 32 and a second end 28 separated by a length (LENGTH). On the length of the PCB is a reference vortex MTJ sensory array 26, circuit components 34 (e.g., a potentiometer, amplifiers, resistors, etc.), and a signal vortex sensor array 24. The reference vortex MTJ sensor array 26 and the signal vortex MTJ sensor array are separated by a base length (BASE LENGTH). The base length (BASE LENGTH) may be equal to the length (LENGTH) of the PCB, but may be less than the length of the PCB (LENGTH). The spatial resolution of the magnetic gradiometer can be based on a size of the signal and reference vortex MTJ sensor arrays, a size of the excitation coil, the base length, and/or the standoff distance. For example, when designing the magnetic gradiometer 10, the MTJ sensor arrays 26, 24 can be placed with a base length (BASE LENGTH) that is roughly proportional to a known standoff distance.

The reference vortex MTJ sensor array 26 is proximal to the first end 32 and can generate a voltage based on the excitation magnetic field; this voltage can be based on an ambient signal and/or additional noise. The signal vortex MTJ sensor array 24 is proximal to the second end 28 and can generate another voltage based on the excitation magnetic field due to a composition of the measurement target when the second end of the PCB 22 is oriented towards the measurement target and the ambient signal and/or additional noise. A differential amplifier cancels a substantial amount of the ambient signal and provides an intended signal based on the composition of the measurement target as a voltage output. In other words, the differential amplifier allows for low-noise signal amplification because the two MTJ sensor arrays are balanced under a spatially uniform magnetic field. Balancing of the two MTJ sensor arrays under a spatially uniform magnetic field can be easily and quickly adjusted using one single potentiometer. Once balanced, the magnetic gradiometer can be used for a long time (e.g., at least 1 day, at least 3 days, at least a week, etc.) without any need for further adjustment owing to the at least substantially non-hysteretic behavior (in other words, low hysteresis from 0-1 Oe) of magnetic vortex state. Also, the low power consumption of the MTJ sensor arrays and the amplification circuits allows for battery-powered devices for mobile applications.

Figure 4:
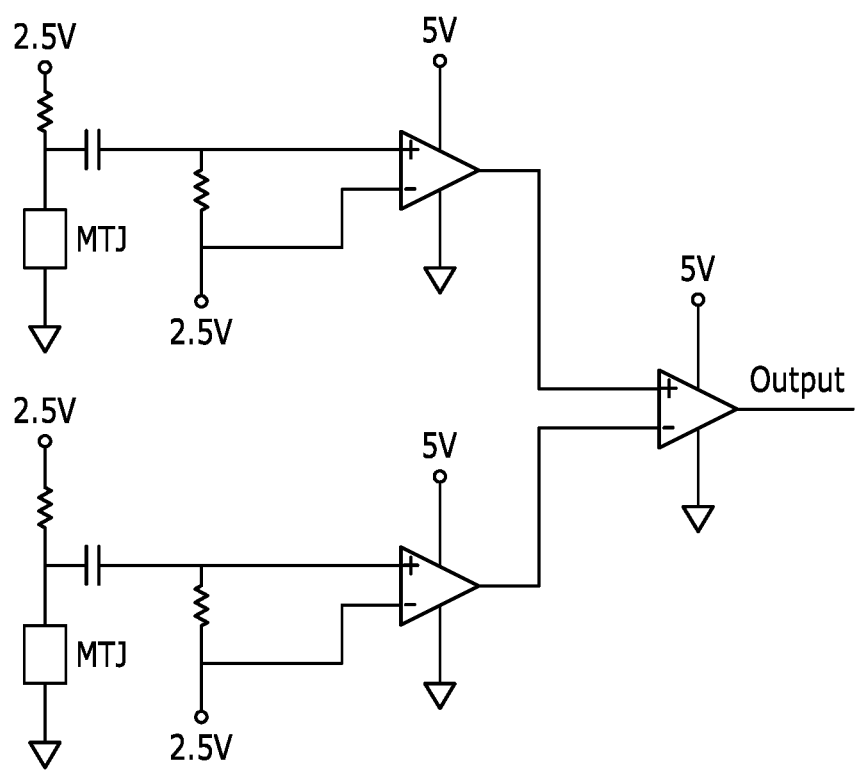
FIG. 4 is an example circuit diagram of the circuit portion of the vortex MTJ sensor-based magnetic gradiometer shown in FIG. 3.

An example configuration of the circuitry components 34 of the differential sensor are shown in detail in FIG. 4. The differential sensor can balance a sensitivity of the reference vortex MTJ sensor array and a sensitivity of the signal vortex MTJ sensor array so the magnetic gradiometer is capable of ignoring the ambient magnetic field. In one example, the circuitry components can also include a potentiometer and at least one amplifier. The potentiometer can be located on the PCB proximal the reference vortex MTJ sensor array and can be configured to amplify the voltage of the reference vortex MTJ sensor array. The amplifier can be configured to amplify the voltage of the signal vortex MTJ sensor array. The potentiometer adjusts a gain associated with the reference vortex MTJ sensor array to balance the sensitivities of the reference vortex MTJ sensor array and the signal vortex MTJ sensor array. The potentiometer can be linked to another amplifier connected to the reference vortex MTJ sensor array. For the optimal ambient field cancellation, sensitivities of the two vortex MTJ sensor arrays and their corresponding amplifiers must be precisely matched all the time. The example in FIG. 4 is just an example showing the principle of the circuitry for the magnetic gradiometer; a person having ordinary skill in the art will understand that other configurations are possible for the circuitry of the magnetic gradiometer to accomplish the optimal magnetic field cancellation.

Figure 5:
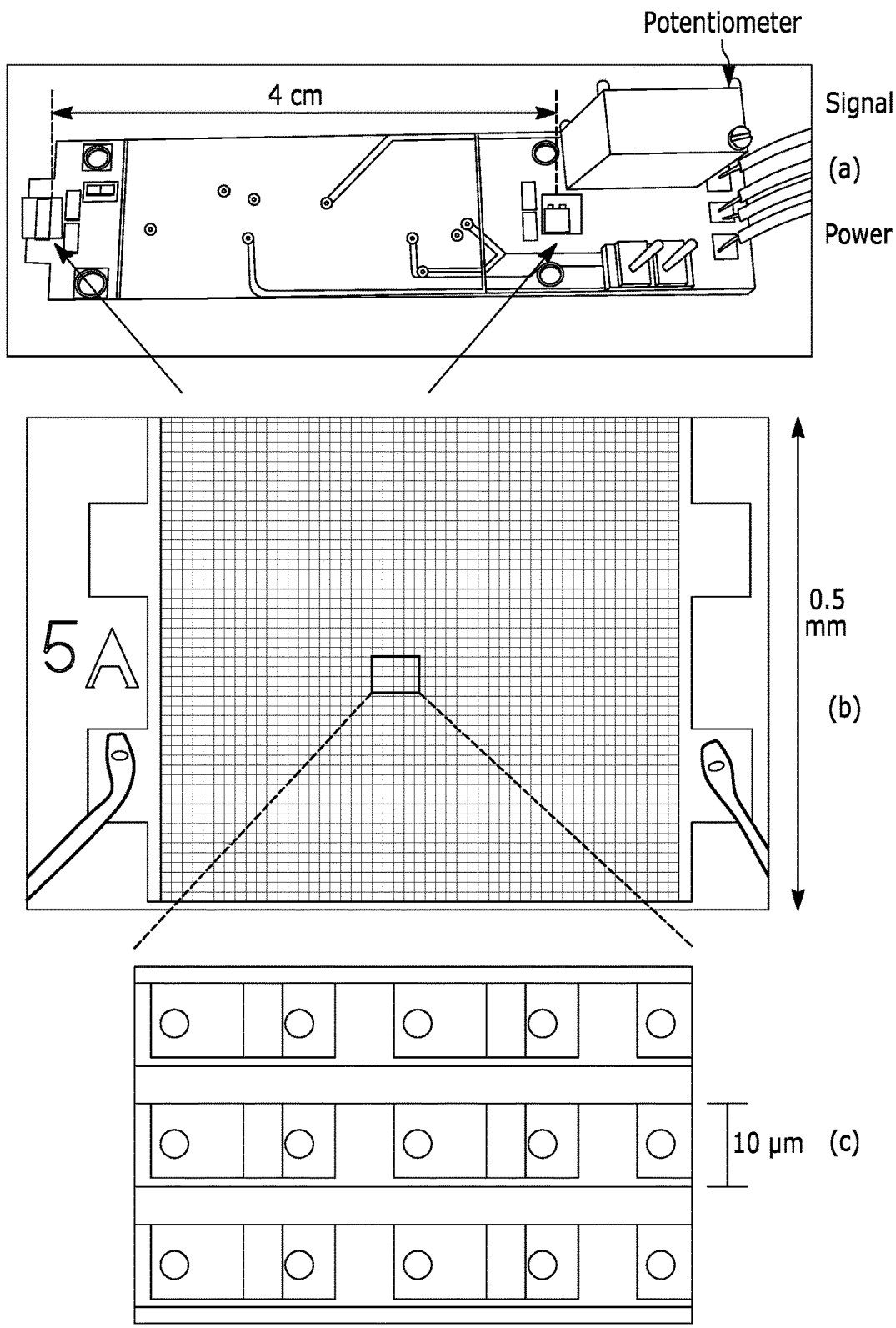
FIG. 5 shows examples of how the circuit portion of the vortex MTJ sensor-based magnetic gradiometer shown in FIG. 3 can be implemented.

FIG. 5 element (a) shows an example magnetic gradiometer with a base length of 4 cm between the signal vortex MTJ sensor array and the reference vortex MTJ sensor array. Additional visible circuit elements include a single potentiometer to control the gain of the reference vortex MTJ sensor array. The other amplifiers and resistors are within the circuit. The gradiometer is shown attached to a signal cable and a power cable that attach to a power source and signal generator and/or controller that are not shown. Element (b) shows an example view of a vortex MTJ sensor array where the array is approximately 0.5 mm by 0.5 mm in size. Each of the reference vortex MTJ sensor array and the signal vortex MTJ sensor array comprises at least one MTJ sensor element. Element (c) shows a zoomed in portion of the sensor array of element (b) where individual MTJ sensor elements are visible. The individual sensor elements are less than 10 µm by 10 µm in size. The reference vortex MTJ sensor array and the signal vortex MTJ sensor array can each comprises an array of 48×32 MTJ sensor elements.

Figure 6:
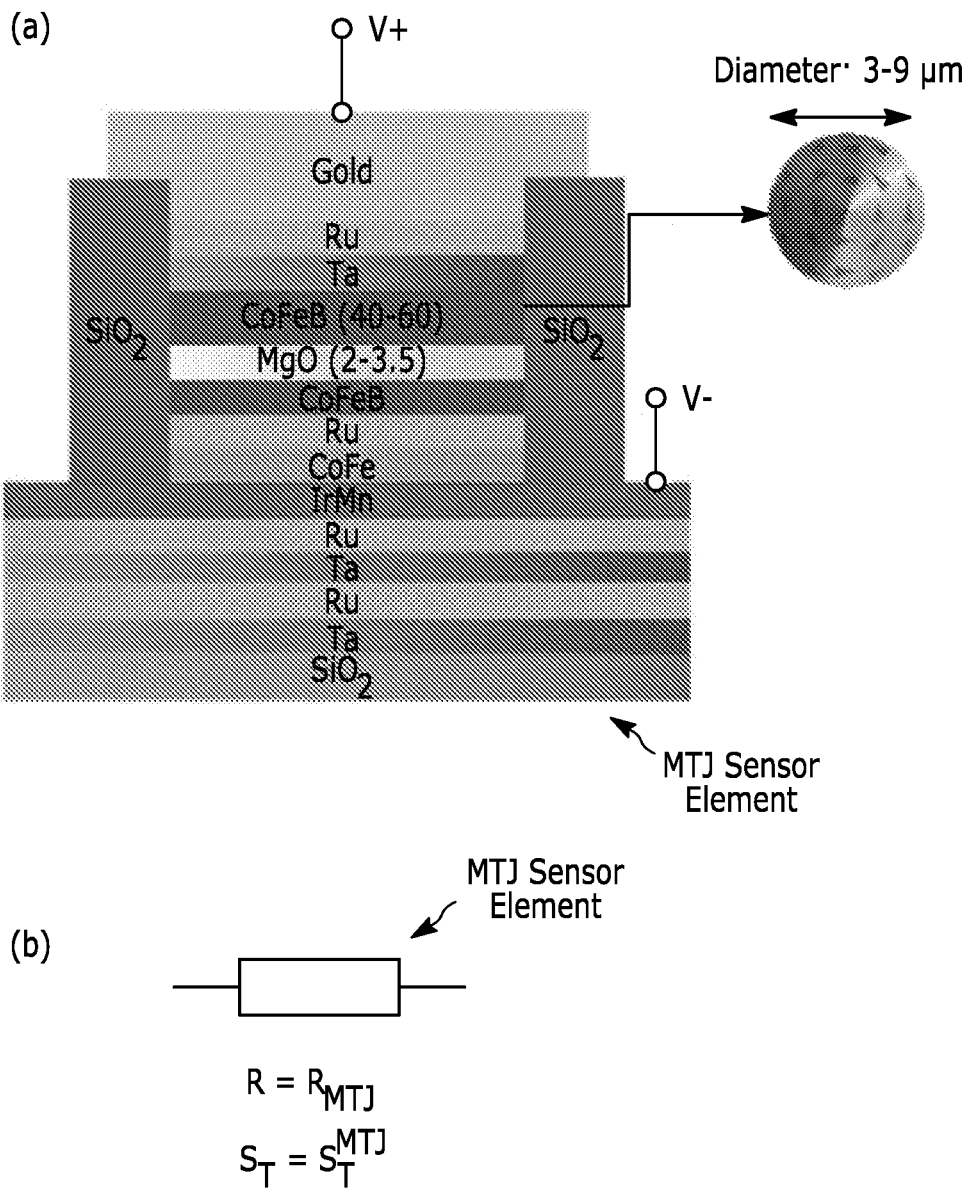
FIG. 6 is an example of a vortex MTJ sensor that can be used within either of the signal or reference vortex MTJ sensor array of the vortex MTJ sensor-based magnetic gradiometer of FIGS. 1-4

FIG. 6 shows an example (element a) of a vortex MTJ sensor that can be within either vortex MTJ sensor array. The magnetization direction is vortexing, indicating that the MTJ sensor element has vortex magnetization in the free layer. The vortex MTJ sensor elements can be fabricated with the layer stack sequenced as: $Si/SiO_2/Ta(50)/Ru(300)/Ta(50)/Ru(20)/Ir_{22}Mn_{78}(180)/Co_{50}Fe_{50}(30)/Ru(8.5)/Co_{40}Fe_{40}B_{20}(30)/Co_{50}Fe_{50}(5)/MgO(29)/Co_{40}Fe_{40}B_{20}(4)/Co_{50}Fe_{30}(5)/Co_{40}Fe_{40}B_{20}(600)/Ta(50)/Ru(100)$, where the numbers in parentheses represent the thickness of each layer in angstrom. This layer stack sequence should be considered as an example. Modified layer stack sequence and layer thickness are possible for similar or better magnetic sensing performance. The fabrication process includes magnetron sputtering at a high vacuum of base pressure $2\times10^{-8}$ torr, photolithography, ion milling, and thermal annealing at 553K for 1 hour. Each MTJ sensor element can have a circular disk shape of 5 µm diameter, and 48×32 such MTJ sensor element can form a compact array with a size of 0.5×0.5 $mm^2$, with 48 MTJ sensor elements connected in series as one row and 32 of such rows being connected in parallel. Element (b) shows a simple representation of the MTJ sensor element that is used in FIG. 7.

Figure 7:
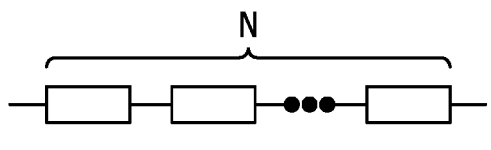
FIG. 7 shows example series (a), parallel (b), and series and parallel (c) configurations of vortex MTJ sensor elements of the vortex MTJ sensor-based magnetic gradiometer of FIG. 3.
Figure 7:
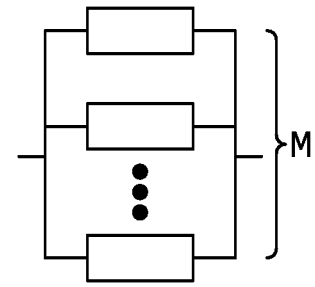
Figure 7:
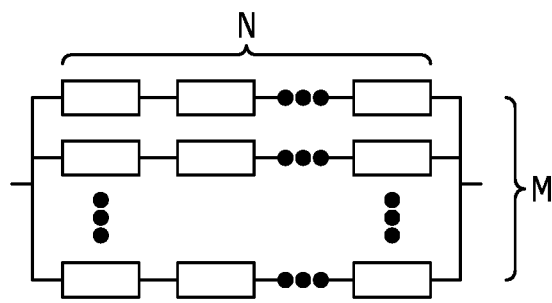

At least one of the reference vortex MTJ sensor array and the signal vortex MTJ sensor array comprises series connections within array rows and parallel connections between each of the array rows. FIG. 7 element (a) shows an example of sensor elements connected in series. Element (b) shows an example of sensor elements connected in parallel. Element (c) shows an example of the sensor elements in a row of an array being connected in series and each of the rows of the sensor array being connected in parallel with one another. Connecting the elements of the MTJ sensor arrays this way can minimize magnetic hysteresis such that the magnetic gradiometer, an individual MTJ sensor element, the reference vortex MTJ sensor, and/or the signal vortex MTJ sensor is at least substantially magnetically hysteresis free (e.g., from 0-1 Oe). In one example configuration of the magnetic gradiometer, each of the reference vortex MTJ sensor array and the signal vortex MTJ sensor array comprise a total of 40,000 or less MTJ sensor elements in series connections within array rows and parallel connections between each of the array rows. The combination of series connections and parallel connections has the effects of reducing the intrinsic noise of the MTJ sensors and providing appropriate electrical resistances for the circuit.

Figure 8:
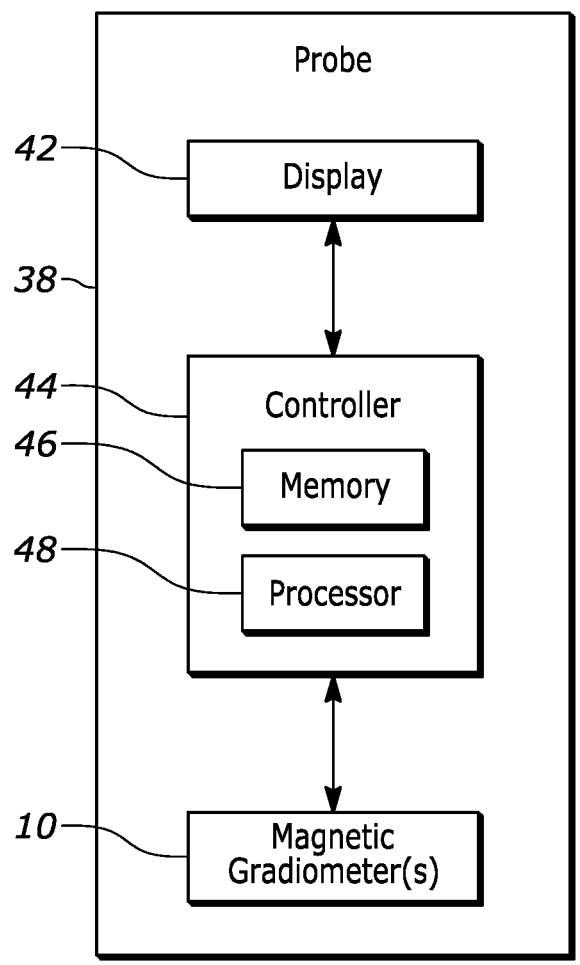
FIG. 8 is an example probe that can include one or more example vortex MTJ sensor-based magnetic gradiometer shown in FIG. 1.

As shown in FIG. 8, the magnetic gradiometer 10 can be configured in a probe 38. The probe 38 can include one or more magnetic gradiometers 10. For example, a plurality of magnetic gradiometers can be positioned radially on a platform around a center point with the second end pointed outwards. The magnetic gradiometer 10 can be controlled by a controller 44 with a non-transitory memory 46 and a processor 48. The memory 46 can store instructions and data, while the processor 48 can access the memory 46 to execute the instructions using the data, in some instances. The processor 48 can be any type of device (e.g., a central processing unit, a microprocessor, or the like) that can facilitate the execution of instructions for measuring magnetic fields at one or more measurement targets. The non-transitory memory 46 can include one or more non-transitory medium (not a transitory signal) that can contain or store the program instructions for measuring magnetic fields at one or more measurement targets. Examples (a non-exhaustive list) of non-transitory media can include: an electronic, magnetic, optical, electromagnetic, infrared, or semiconductor system, apparatus or device. More specific examples (a non-exhaustive list) of non-transitory media can include the following: a portable computer diskette; a random access memory; a read-only memory; an erasable programmable read-only memory (or Flash memory); and a portable compact disc read-only memory.

For example, the processor 48 can instruct the magnetic gradiometer(s) 10 to collect data at one or more measurement targets and send the data to the memory 46 and then can create a visualization based on the data that is shown on a display 42. The magnetic gradiometer collected data can be a magnetic field measurement at the one or more measurement target, which is output by the magnetic gradiometer(s) 10 as a voltage output. The processor 28 can instruct the voltage output data be processed to indicate magnetic field (in Tesla). The display 42 can show raw data or processed data and may be located either within the probe 38 or external to the probe 38. The display 42 can graphically display a voltage output at a single measurement target or show the voltage output at a plurality of measurement targets in a body. The voltage outputs can be compared to a baseline or compared to the voltage outputs measured at the other measurement targets in the same body. Optionally, the display device can alert (e.g., visual, audible, or tactile) if a voltage output by a magnetic gradiometer is a certain threshold above or below a baseline determined for a material of the body being tested. It should be noted that the processor 48 can be used to perform other tasks, as long as the tasks correspond to instructions that are programmed in the memory 46.

IV. Methods

Figure 9:
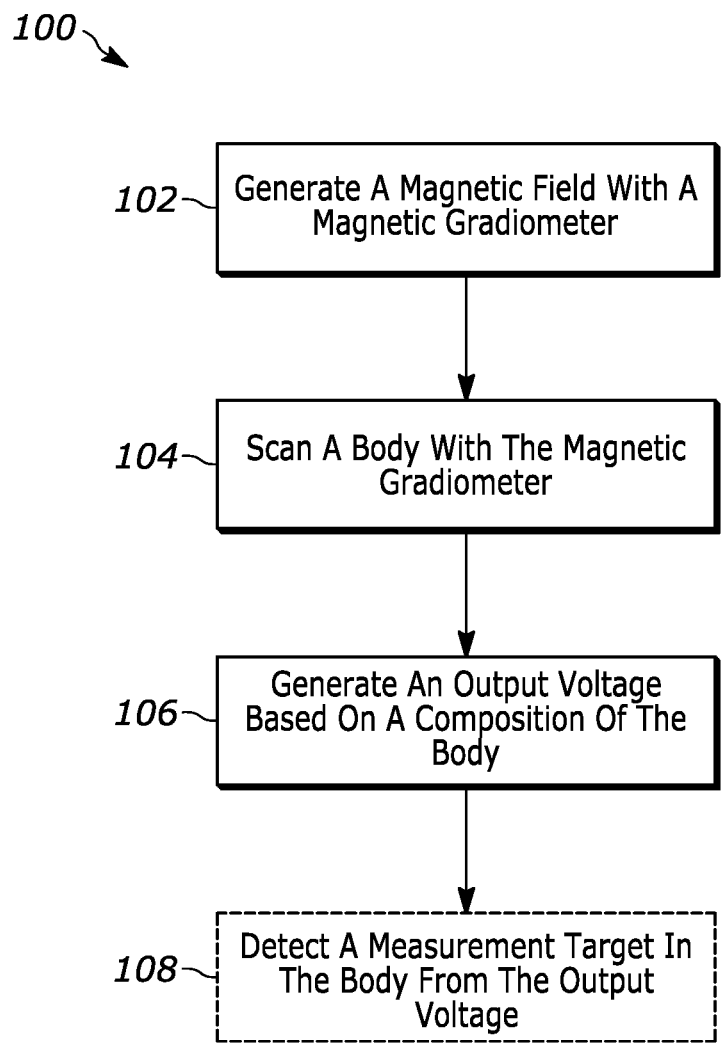
FIG. 9 is a process flow diagram of a method for nondestructive testing using a vortex MTJ sensor-based magnetic gradiometer.

Another aspect of the present disclosure can include method 100 (FIG. 9) for detecting a change in a magnetic field, which can be the result of to the presence of a measurement target having a material defect and/or inhomogeneity within a body being tested that is at least weakly magnetic. The method 100 can be executed using the magnetic gradiometer 10 or the probe 38 shown in FIGS. 1-8. However, this can also be done by a plurality of magnetic gradiometers (e.g., included in a probe 38, implanted at different places within the object, or the like).

The method 100 can be executed by one or more magnetic tunnel junction in magnetic vortex state (vortex MTJ) sensor-based magnetic gradiometer (referred to herein as a magnetic gradiometer). The magnetic gradiometer (e.g., magnetic gradiometer 10) used to execute the method 100 can include an excitation coil (e.g., excitation coil 18) and a circuit on a PCB (e.g., PCB 22) (e.g., shown in FIG. 4 as a differential amplifier) that outputs a differential value between a signal vortex MTJ sensor array (e.g., signal vortex MTJ sensor array 24) and a reference vortex MTJ sensor array (e.g., reference vortex MTJ sensor array 26). The output can indicate the presence of the measurement target. The method 100 can be performed by a single magnetic gradiometer (e.g., magnetic gradiometer 10) or multiple gradiometers (e.g., on probe 38, on or within the object being tested, or otherwise electrically connected).

For purposes of simplicity, the method 100 is shown and described as being executed serially; however, it is to be understood and appreciated that the present disclosure is not limited by the illustrated order as some steps could occur in different orders and/or concurrently with other steps shown and described herein. Moreover, not all illustrated aspects may be required to implement the method 100, nor is method 100 limited to the illustrated aspects.

At 102, a magnetic field is generated by applying an alternating current (AC) to an excitation coil (e.g., excitation coil 18) of a magnetic gradiometer (e.g., magnetic gradiometer 10). Unlike traditional magnetic gradiometers, the magnetic gradiometer described herein can deliver AC rather than DC because the circuitry of the magnetic gradiometer (e.g., the differential amplifier of FIG. 4) can cancel a significant amount of an ambient signal that carries the Earth's magnetic signal and other sources of noise. Based on the AC, the excitation coil can generate a magnetic field.

At 104, the magnetic gradiometer is scanned across the body that may include (or is suspected of including) at least one measurement target. The magnetic gradiometer can include a printed circuit board (e.g., PCB 22) comprising a first end (e.g., first end 32) and a second end (e.g., second end 28) separated by a length (e.g., length). The second end being oriented towards the body being scanned. An excitation coil encircles at least a portion of the PCB (shown, e.g., in FIG. 2) to create an electromagnet for the generation of the magnetic field. On the PCB is a differential sensor (e.g., shown in FIG. 4) comprising a reference vortex MTJ sensor array proximal to the first end and a signal vortex MTJ sensor array proximal to the second end. The reference vortex MTJ sensor array and the signal vortex MTJ sensor array are separated by a base length (which may be variable between a few microns to a few hundred centimeters depending on the application). The base length can be equal to the length of the PCB if the MTJ sensor arrays are located at the ends of the PCB. However, the base length may be shorter than the length of the PCB. Scanning the magnetic gradiometer across the body also includes, maintaining the magnetic gradiometer at a standoff distance away from the at least one measurement target. The standoff distance can be a distance separating the sensing MTJ sensor array and the measurement target (e.g., the standoff distance may be 10 cm or less in some instances, but the standoff distance can be from 0 to 50 cm).

At 106, an output voltage of the magnetic gradiometer is generated (e.g., from the differential amplifier) based on a composition of the body. The output voltage is based on a voltage generated by the reference vortex MTJ sensor arrays' detection of at least an excitation magnetic field and another voltage generated by the signal vortex MTJ sensor array's detection of an excitation magnetic field due to a composition of the body (an intended signal) and an ambient magnetic field. The voltage generated by the reference vortex MTJ sensor array's detection of the excitation magnetic field and the other voltage generated by the signal vortex MTJ sensor array's detection of the excitation magnetic field due to the composition of the body comprising the at least one measurement target each comprise an ambient signal based on an ambient magnetic field. The ambient magnetic field can be for example, the Earth's magnetic field. The ambient magnetic field can, additionally or alternatively, include a noise source. The differential sensor cancels a substantial amount of the ambient signal and/or other noise and provides an intended signal (e.g., from the body) as the voltage output.

Optionally (if the measurement target is within the body), at 108, the magnetic gradiometer can detect the measurement target in the body from the output voltage. The detected measurement target can be a material defect or material inhomogeneity when the output voltage provided by the magnetic gradiometer at the measurement target differs from a baseline. The baseline can be an expected voltage output of the material of the body based on at least one of the output voltage at other measurement targets in that body or previously known voltage outputs from another body with the same or a similar material composition. The output voltage of the magnetic gradiometer fluctuates when the excitation magnetic field of the at least one measurement target is disrupted by at least one of the material defect or material inhomogeneity when the material defect or material inhomogeneity changes a magnetic composition of the at least one measurement target from the composition of the body Additionally, in some instances, the voltage output by the magnetic gradiometer can be displayed on a display device comprising a processor and a non-transitory memory (e.g., the probe 38 or a separate computing device such as a computer, smartphone, etc.). The display can graphically display a voltage output at a single measurement target or show the voltage output at a plurality of measurement targets in a body. The voltage outputs can be compared to a baseline or compares to the outputs measured at the other measurement targets in the same body. The voltage output can also be processed (e.g., by the display device) to a magnetic field reading (in Tesla) prior to graphical display. Optionally, the display device can alert (e.g., visual, audible, or tactile) if a voltage output by a magnetic gradiometer is a certain threshold above or below a baseline for a material of the body being tested.

IV. Experimental

The following experiment demonstrates the design and utility of a magnetic gradiometer as described herein.

While ferrous metals are prevalent in infrastructure, traditional cement does not typically include any ferrous metals. Insulating cement can become weakly magnetic by impregnating magnetic powders into its slurry (Class H cement). Such cement is being more widely used. However, to inspect the structural integrity of such cement, the limited standoff distance of MFL comes into conflict with the centimeter-thick fiberglass casing on a cement sheath. Larger standoff distances are required to inspect the structural integrity of structures composed of such cement. The magnetic gradiometer described herein can be used to perform nondestructive testing on weakly magnetic surfaces with a standoff distance, as shown in this experiment. The magnetic gradiometer utilizes highly sensitive magnetic tunneling junction (MTJ) sensors, which enjoy compelling advantages over different types of magnetic sensors, including low power consumption (~1 mW), broad bandwidth (up to GHz), miniaturized size (~10 μm), and a compatibility with silicon circuit technology.

Design of Magnetic Gradiometer

For the optimal ambient field cancellation, sensitivities of the two magnetic sensors must be precisely matched all the time. Sensors with a large magnetic hysteresis are thus not suitable, due to the time drift in sensitivities caused by irreversible magnetic domain wall motions. For this purpose, MTJs with vortex magnetization in the free layer were fabricated, which can assure non-hysteretic operations. The layer stack was sequenced as: $Si/SiO_2/Ta(50)/Ru(300)/Ta(50)/Ru(20)/Ir_{22}Mn_{78}(180)/Co_{50}Fe_{50}(30)/Ru(8.5)/Co_{40}Fe_{40}B_{20}(30)/Co_{50}Fe_{50}(5)/MgO(29)/Co_{40}Fe_{40}B_{20}(4)/Co_{50}Fe_{30}(5)/Co_{40}Fe_{40}B_{20}(600)/Ta(50)/Ru(100)$, where the numbers in parentheses represent the thickness of each layer in angstrom. The fabrication process includes magnetron sputtering at a high vacuum of base pressure 2×10−8 torr, photolithography, ion milling, and thermal annealing at 553K for 1 hour. Each MTJ element had a circular disk shape of 5 μm diameter, and 48×32 such MTJs formed a compact array with a size of 0.5×0.5 mm$^2$, with 48 MTJs connected in series as one row and 32 rows in parallel, shown in the optical micrograph of FIG. 1(a). The performance of this MTJ sensor has been fully characterized, including the MTJ sensor having a large linear operation range of +/−10 mT. In this range the sensor is hysteresis-free, with a decent sensitivity of 3.0%/mT (the change of magnetoresistance per milli-tesla), which only decreases to 2.7%/mT at +/−10 mT. In a wide temperature range from 250 to 350 K, the thermal coefficient of sensitivity is −400 ppm/K, indicating a high degree of thermal stability. The gradiometer built with this MTJ sensor worked well within these ranges.

Figure 10:
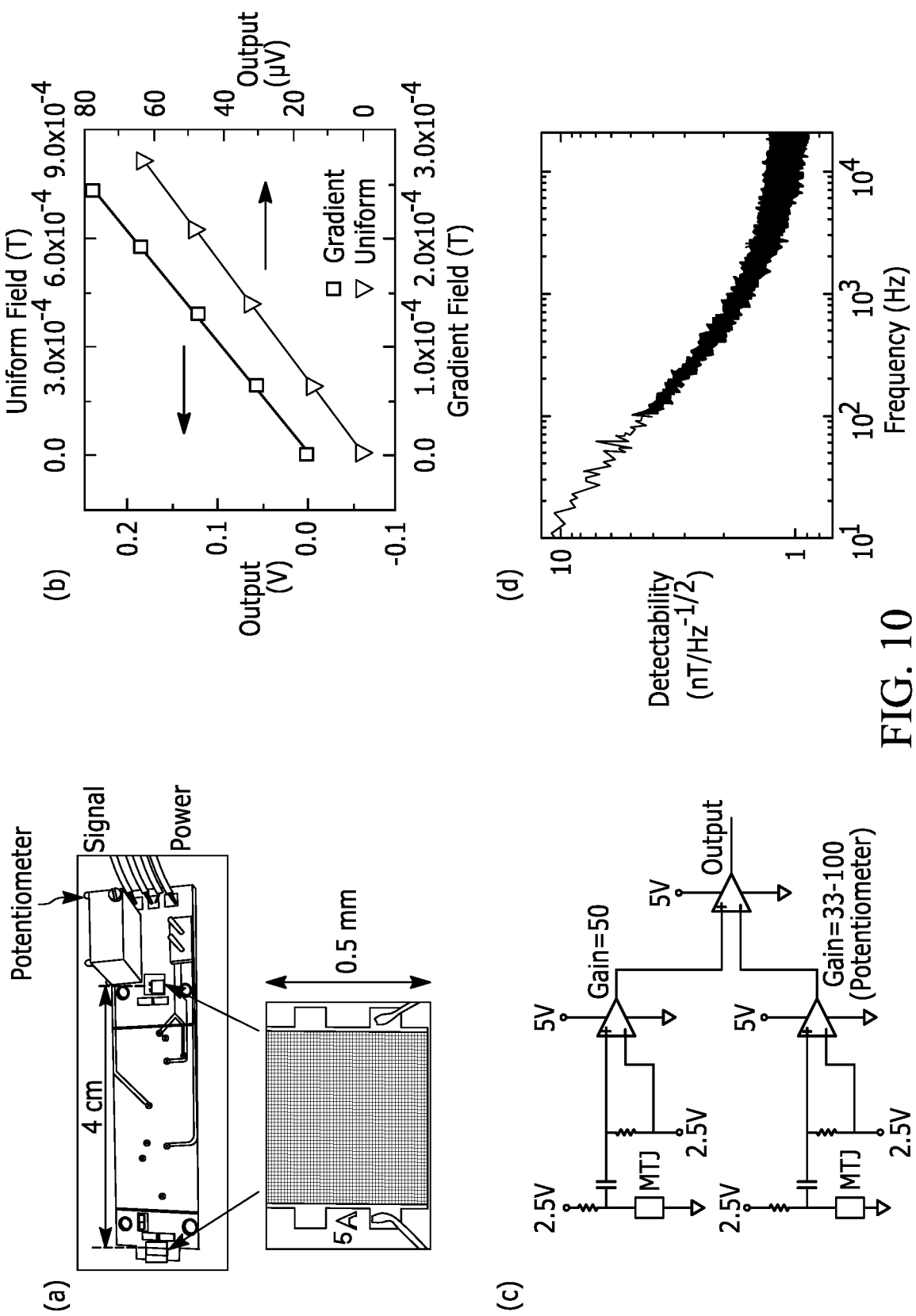
FIG. 10 shows an example experimental setup of the circuit portion of the magnetic gradiometer and experimental results of testing the experimental setup.

FIG. 10, element (a) shows the gradiometer with two MTJ sensors wire-bonded onto a printed circuit board (PCB), whose signal conditioning circuitry is shown in FIG. 10, element (c). The circuit is powered by four AAA batteries. Two sensors each under a 1 V bias voltage are separated by a base length of 4 cm. The voltage signals from the two sensors first pass through high-pass filters with a −3 dB point at 5 Hz, then get boosted separately by two identical amplifiers (Texas Instruments INA828 Instrumental Amplifier) of negligible noise 7 nV/$\sqrt{Hz}$. The signal from the "signal sensor" at the edge of the PCB is amplified by 50 times, while the other "reference sensor" has a tunable amplification factor between 33 and 100, adjustable through a potentiometer. After an initial adjustment of the potentiometer, a close match of two sensitivities can be achieved and maintained. Next, the amplified signals are differentiated and read by data acquisition devices (DAQ). Software-based lock-in amplification was performed finally to extract the signal at a specific frequency, with a small time constant of 200 ms (0.7 Hz noise bandwidth).

The voltage output of the gradiometer can be expressed as:

$$V=D[H(z_1)-H(z_2)]+C[H(z_1)+H(z_2)]/2$$

where $z_1$ and $z_2$ are the positions of the signal and reference sensors, D and C are meant to be the sensitivities for gradient and uniform fields, respectively. Calibration for these parameters is done in a pair of single-axis Helmholtz coils. When the current in two coils runs in parallel directions, a uniform magnetic field is generated and $C=H(z_1)/V=H(z_2)/V$ is obtained. When in anti-parallel directions, a gradient field gives $D=[H(z_1)-H(z_2)]/V$. In FIG. 10, element (b), the voltage signals from the gradiometer in these two kinds of fields were fitted by a linear relation, from which D=989.6 V/T and C=0.078 V/T were obtained. It gives a large CMRR (common-mode rejection ratio) of 82 dB, even comparable to a SQUID gradiometer operating at liquid helium temperature. Moreover, the intrinsic noise power spectrum density of the gradiometer was measured at no external magnetic field in an unshielded environment and then divided by the sensitivity D to obtain the magnetic field detectability in FIG. 10, element (d). At the 1 kHz operating frequency of the gradiometer, the field detectability reaches 1.6 nT/$\sqrt{Hz}$.

MFL Probe Modelling and Testing

Figure 11:
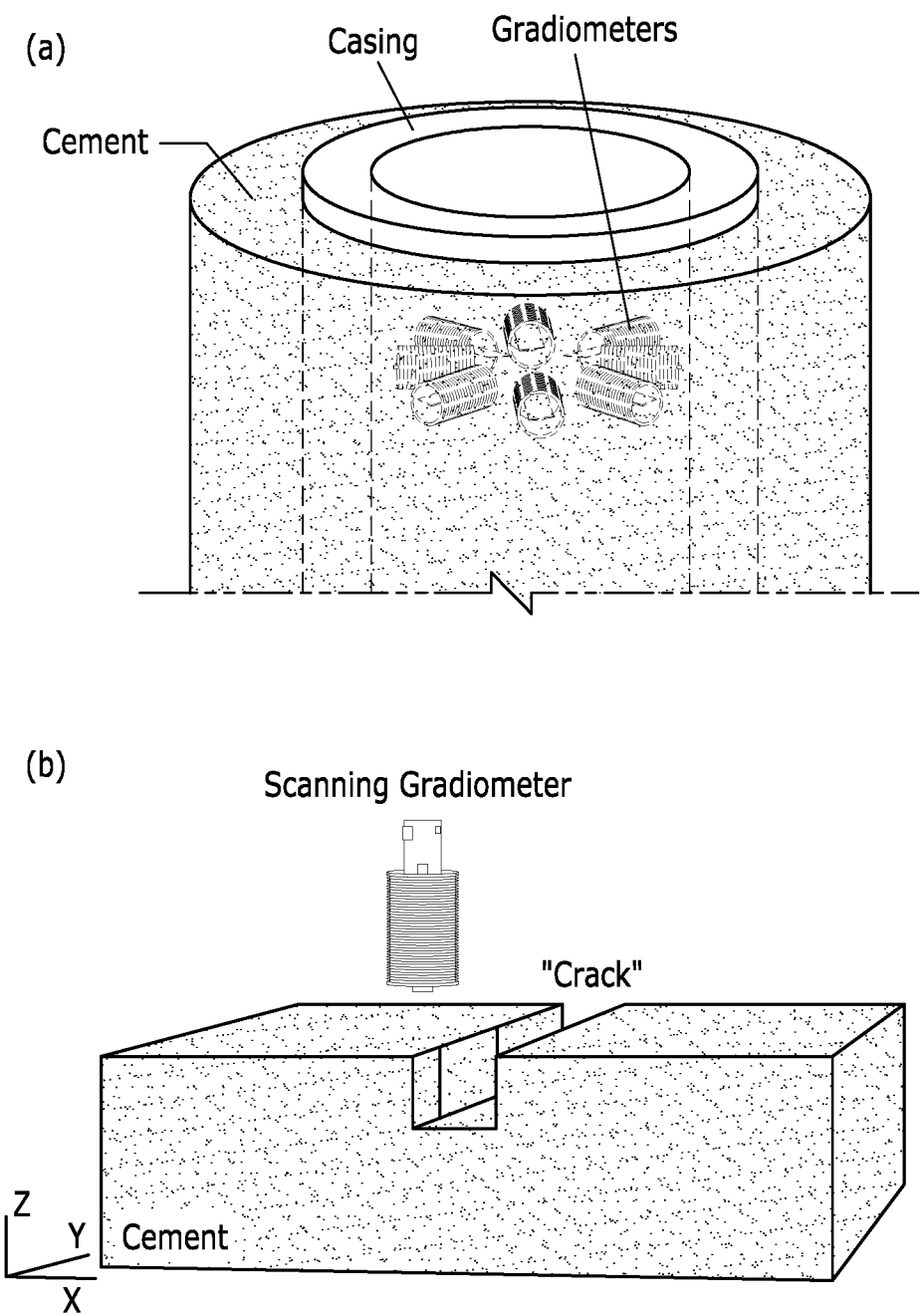
FIG. 11 shows an example testing platform with 8 magnetic gradiometers installed to scan a wellbore.

To demonstrate the probes actual configuration in the inspection of wellbore integrity, FIG. 11, element (a) shows a proposed MFL testing scheme inside a wellbore, where the probe includes a testing platform with 8 gradiometers installed in a circumferential configuration for insertion into a wellbore. The platform rotates and scans circumferentially to detect hidden cracks in the cement behind the casing. Considering the large size of the wellbore, close to its inner surface, the rotating scan is analogous to a planar measurement if the surface curvature is neglected, as shown in FIG. 11, element (b). This represents an elementary defect unit as a benchmark, from which multiple kinds of defects in miscellaneous situations can be estimated.

Numerical Simulation of Cracked Magnetic Cement and MFL Probe

Next, magnetic cement was modeled in simulation as a large flat slab with a thickness of 5 cm, similar to FIG. 11, element (b). The signal sensor of the gradiometer is located above the surface with a standoff distance of $h_1$. Embedded beneath the surface is a void ("crack") in the shape of a long square tube, placed along the Y-direction with a cross section of 2×2 cm$^2$. Such square-shaped crack is assumed as a general case, since cracks of other irregular shapes can also be detected as long as their sizes are similar. The depth of the crack is $h_2$, and the horizontal distance from the crack to the signal sensor is S. The excitation coil for magnetization induction has a diameter of 2.5 cm, a 3.4 cm length, and 120 turns winding, operating with 1 A current at 1 kHz. The gradiometer is placed symmetrically along the axis of the coil, so that the excitation field is common to both signal and reference sensors. The sensors measure the vertical component $H_z$ (Z-axis) of the magnetic fields. Under these conditions, COMSOL® Multiphysics software was used to simulate the magnetic field lines shown as red arrows in FIG. 12, element (a), based on Ampere's law. The cell size used for meshing was 0.05 cm near the sensor region, and the zero-potential boundary was a spherical surface 2 meters away from the sensors. The relative permeability of the cement was taken as 1.09, which will be explained in the later experimental section. From the simulation, the common-mode field at the sensor position was 1.14 mT within the MTJ linear range. The spatially differential field $\Delta H_Z$ due to the embedded "crack" was sensed by the dual signal and reference sensor, corresponding to the gradiometer output.

Figure 12:
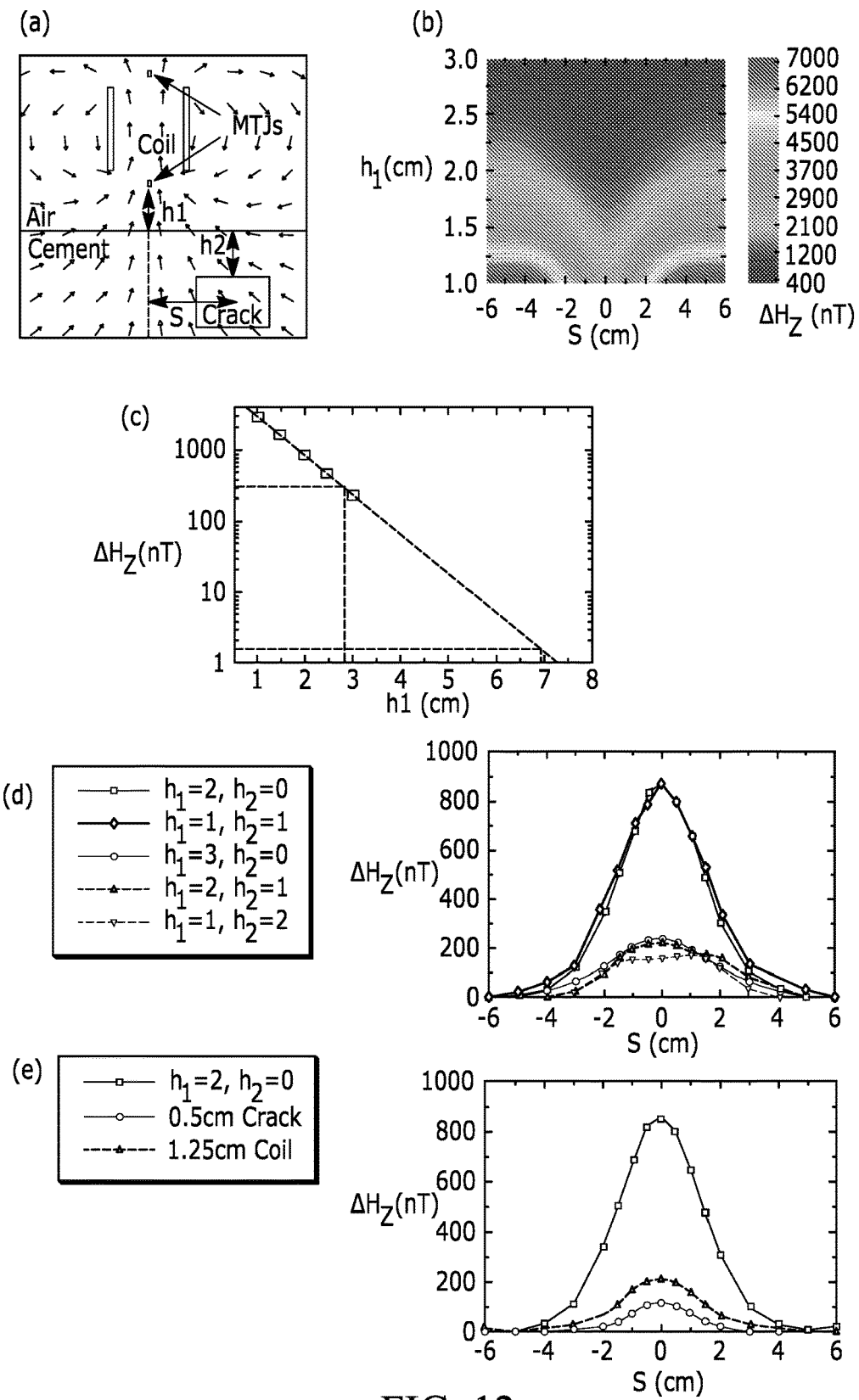
FIG. 12 shows the relationship of standoff distance to detecting an artificial crack in cement.

FIG. 12, element (b) shows the simulated map of the differential field $\Delta H_Z$ in the plane of FIG. 12, element (a), at positions of different Sand $h_1$, with $h_2=0$ as a surface crack case. FIG. 12, element (c) shows an exponential decay of $\Delta H_Z$ at S=0 position of FIG. 12, element (b), with a fitting line on the simulation data. During an MFL measurement, the gradiometer scans horizontally across the crack region. Accordingly, FIG. 12, element (d) shows $\Delta H_Z$ as a function of S, mimicking scans under different $h_1$, $h_2$ values (in cm), with values at S=±6 cm deducted as offset. For $h_1+h_2=2$, considering the cases of a surface crack ($h_1=2$, $h_2=0$) and an embedded crack ($h_1=1$, $h_2=1$), the scanned $\Delta HA_Z(S)$ profiles resembles a similar bell curve with a peak value of 860 nT and a FWHM (full width at half maximum) of about 3.2 cm. Increasing $h_1+h_2$ to 3 cm, three cases were examined: a surface crack ($h_1=3$, $h_2=0$), a shallow crack ($h_1=2$, $h_2=1$), and a deep crack ($h_1=1$, $h_2=2$). Again, all the scanned $\Delta H_Z(S)$ profiles are similar, with a peak value of 210 nT and a FWHM of about 4.2 cm. Conclusively speaking, regardless of how deep the crack is imbedded, its $\Delta H_Z$ decays exponentially with the sensor-to-crack distance $h_1+h_2$. Considering a 300 nT detectable limit, the intercept on the fitting line in FIG. 12, element (c) implies that the gradiometer could see such surface crack with standoff distances between 2 and 3 cm. The characteristic FWHM is further studied in FIG. 12, element (e) for a smaller coil of 1.25 cm diameter and a smaller crack with cross section of 0.5×0.5 cm$^2$, with other conditions the same as the ($h_1=2$, $h_2=0$) case in FIG. 12, element (d). FWHM decreases from 3.2 to 2.2 cm reasonably for a smaller crack. With a smaller coil the FWHM doesn't change, but the amplitude of $\Delta H_z$ decreases. This is on account of a more localized field, which magnetized less cement region.

MFL Probe Testing

Figure 13:
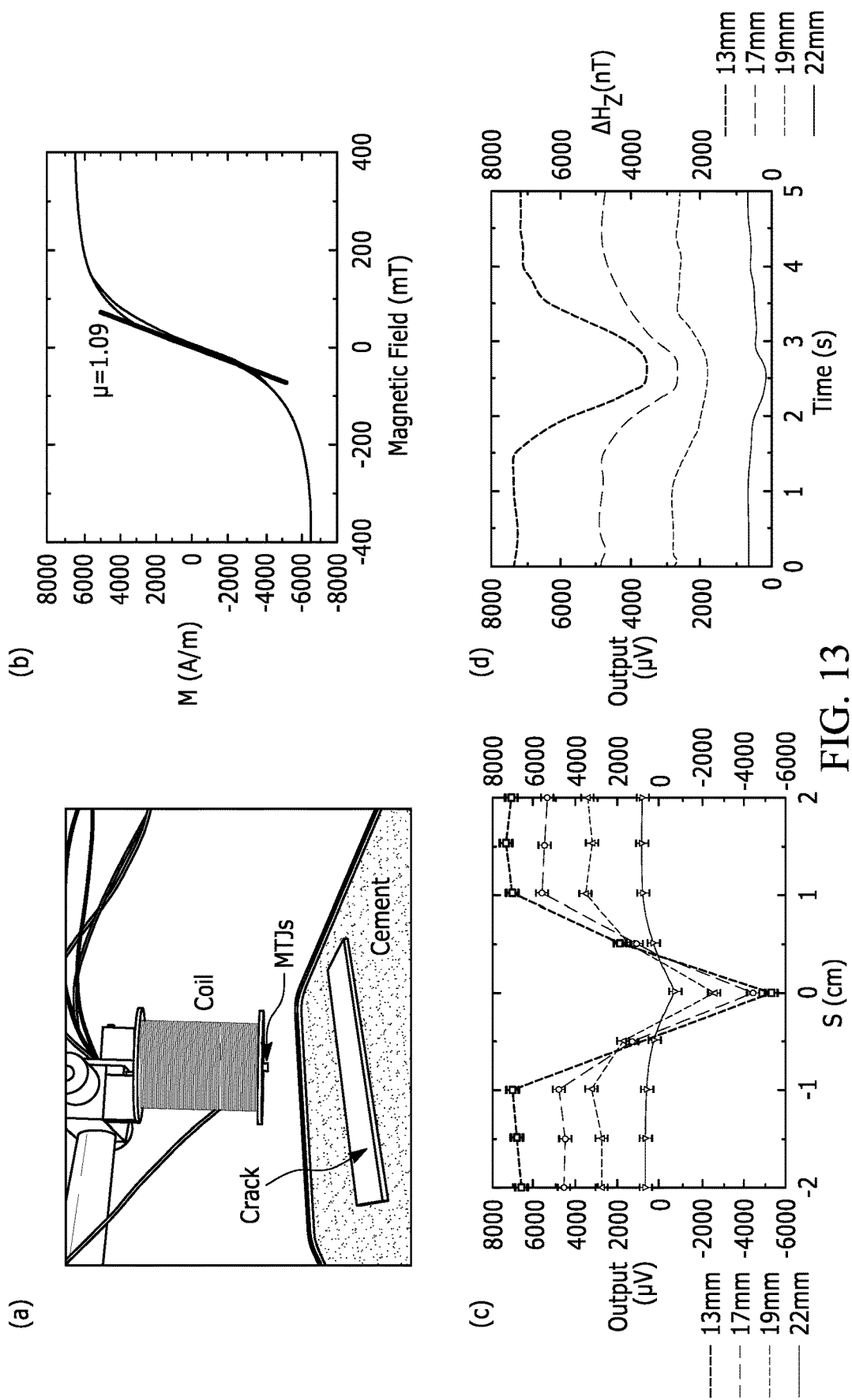
FIG. 13 shows detection of an artificial crack in cement.

The gradiometer-based MFL probe was tested on real magnetic cement for experimental confirmation. FIG. 13, element (a) shows the experimental setup for MFL testing using the gradiometer, as an identical realization of FIG. 13, element (b). The surface crack ($h_2$=0) case was imitated by embedding a square-shaped plastic rod into the magnetic cement. The magnetic cement was imitated by impregnating a small amount of ferromagnetic $Fe_3O_4$ particle powder (Alpha Chemicals®) into common plaster. The volume fraction of the $Fe_3O_4$ particles is 4.6% corresponding to a mass fraction of 6.0%. FIG. 13, element (b) shows its magnetic hysteresis loop at room temperature, measured by the vibrating sample magnetometer in the Quantum Design® Physical Property Measurement System. The central slope of the magnetic hysteresis curve gives a relative permeability of 1.09 for the magnetic cement. Relevant works in literature typically use similar volume fractions of magnetic particles in cement (4%), larger values of cement permeability (above 1.25) or wellbore structures with big cracks (10 to 20 cm), and the iron powder in the impregnated cement has shown negligible impact on overall mechanical behavior. Comparatively, these experiments focused on smaller crack sizes (2 cm) and a more available permeability (1.09). FIG. 13, element (c) shows the voltage output of the gradiometer in a scan across the crack. At each "S" position the voltage signal was amplified and read by the lock-in amplifier for 5 seconds. In this period of time, the mean value was recorded as the voltage output, and the standard deviation was recorded as the noise signal (error bar in the figure). The rather long averaging time was to ensure an accurate determination of the signal level and particularly the noise level. To ensure a good signal-to-noise ratio, the scanning device should remain stabilized during the data collection with a constant standoff distance. The experimental voltage output values on the left axis were converted to a corresponding $\Delta H_z$ on the right axis by previous sensitivity D=989.6 V/T. A 300 µV voltage fluctuation is observed and plotted as error bars, corresponding to a detectable field limit of $\Delta H_z$=300 nT. A discernible signal change was observed when the probe moved directly above the crack, demonstrating that the probe is capable of detecting a 2 cm wide surface crack from around 22 mm high above. Above this distance, the signal change due to the crack becomes smaller than the noise fluctuation and is indiscernible. This is consistent with the simulation prediction discussed above. The $\Delta H_z$ range in FIG. 13, element (c) seems bigger than FIG. 12, element d), because the latter focuses on larger liftoff distances. To test the response speed of the gradiometer for application considerations, the gradiometer was quickly moved across the crack at a speed of 2 cm/s, with the output signal recorded continuously in FIG. 13, element (d). The presence of the crack was still visible at all distances, yet the peak height was smaller than that of the static measurement with time averaging. This effect is technically due to the large time constant of the lock-in amplification which limits the signal slew rate.

From the above description, those skilled in the art will perceive improvements, changes and modifications. Such improvements, changes and modifications are within the skill of one in the art and are intended to be covered by the appended claims.

The following is claimed:

1. A magnetic gradiometer comprising:
a printed circuit board (PCB) comprising a first end and a second end separated by a length;
an excitation coil encircling at least a portion of the PCB and configured to deliver an alternating current (AC) to generate an excitation magnetic field; and
a differential sensor comprising:
a reference magnetic tunneling junction in magnetic vortex state (vortex MTJ) sensor array proximal to the first end to generate a voltage based on the excitation magnetic field; and
a signal vortex MTJ sensor array proximal to the second end to generate another voltage based on the excitation magnetic field due to a composition of a measurement target, wherein the second end of the PCB is oriented towards the measurement target, and wherein the reference vortex MTJ sensor and the signal vortex MTJ sensor are separated by a base length.

2. The magnetic gradiometer of claim 1, wherein the voltage based on the excitation magnetic field and the other voltage based on the excitation magnetic field due to the composition of the measurement target each comprise an ambient signal based on an ambient magnetic field.

3. The magnetic gradiometer of claim 2, wherein the differential sensor cancels a substantial amount of the ambient signal and provides an intended signal based on the composition of the measurement target as a voltage output.

4. The magnetic gradiometer of claim 3, wherein the voltage output is based on a standoff distance,
wherein the standoff distance is the distance between the signal vortex MTJ sensor array and the measurement target.

5. The magnetic gradiometer of claim 4, wherein the standoff distance is 10 cm or less.

6. The magnetic gradiometer of claim 1, wherein a sensitivity of the reference vortex MTJ sensor array and a sensitivity of the signal vortex MTJ sensor array are balanced.

7. The magnetic gradiometer of claim 1, wherein each of the reference vortex MTJ sensor array and the signal vortex MTJ sensor array comprises at least one MTJ sensor element.

8. The magnetic gradiometer of claim 1, wherein the reference vortex MTJ sensor array and the signal vortex MTJ sensor array each comprises an array of 48×32 MTJ sensor elements.

9. The magnetic gradiometer of claim 1, wherein at least one of the reference vortex MTJ sensor array and the signal vortex MTJ sensor array comprises series connections within array rows and parallel connections between each of the array rows.

10. The magnetic gradiometer of claim 1, wherein each of the reference vortex MTJ sensor array and the signal vortex MTJ sensor array comprise a total of 40,000 or less MTJ sensor elements in series connections within array rows and parallel connections between each of the array rows.

11. The magnetic gradiometer of claim 1, wherein the magnetic gradiometer, an individual MTJ sensor element, the reference vortex MTJ sensor, and/or the signal vortex MTJ sensor is at least substantially magnetically hysteresis free.

12. The magnetic gradiometer of claim 1, having a spatial resolution based on a size of the signal and reference vortex MTJ sensor arrays, a size of the excitation coil, and/or a standoff distance.

13. The magnetic gradiometer of claim 1, wherein the magnetic gradiometer is configured as a probe for detecting material defects or material inhomogeneities in the measurement target.

14. A method comprising,
generating a magnetic field by applying an alternating current (AC) to an excitation coil of a magnetic gradiometer;
scanning the magnetic gradiometer across a body comprising at least one measurement target, wherein the magnetic gradiometer comprises:
a printed circuit board (PCB) comprising a first end and a second end separated by a length, wherein the second end is oriented towards one of the at least one measurement targets;
an excitation coil encircling at least a portion of the PCB; and
a differential sensor comprising:
a reference magnetic tunneling junction in magnetic vortex state (vortex MTJ) sensor array proximal to the first end; and
a signal vortex MTJ sensor array proximal to the second end,
wherein the reference vortex MTJ sensor array and the signal vortex MTJ sensor array are separated by a base length; and
generating an output voltage of the magnetic gradiometer in response to scanning the magnetic gradiometer across the body comprising that at least one measurement target, wherein the output voltage is based on a voltage generated by the reference vortex MTJ sensor array's detection of at least an excitation magnetic field and another voltage generated by the signal vortex MTJ sensor array's detection of an excitation magnetic field due to a composition of the body comprising the at least one measurement target.

15. The method of claim 14, wherein the voltage generated by the reference vortex MTJ sensor array's detection of the excitation magnetic field and the other voltage generated by the signal vortex MTJ sensor array's detection of the excitation magnetic field due to the composition of the body comprising the at least one measurement target each comprise an ambient signal based on an ambient magnetic field.

16. The method of claim 15, wherein the differential sensor cancels a substantial amount of the ambient signal and/or noise and provides an intended signal as a voltage output resulting from the composition of the body comprising the at least one measurement target.

17. The method of claim 14, wherein scanning the magnetic gradiometer across the body comprising the at least one measurement target further comprises:
maintaining the magnetic gradiometer at a standoff distance away from the at least one measurement target; and
moving the magnetic gradiometer over the body between at least two measurement targets at the standoff distance.

18. The method of claim 14, further comprising:
detecting, by the magnetic gradiometer, at least one of a material defect or a material inhomogeneity in the body when the output voltage provided by the magnetic gradiometer at the at least one measurement target differs from a baseline.

19. The method of claim 18, wherein the output voltage fluctuates when the excitation magnetic field of the at least one measurement target is disrupted by at least one of the material defect or material inhomogeneity that changes a magnetic composition of the at least one measurement target from the composition of the body.

* * * * *